United States Patent [19]

Kunz et al.

[11] Patent Number: 4,924,183

[45] Date of Patent: May 8, 1990

[54] METHOD OF DETERMINING THE SPECTRAL DISTRIBUTION OF THE NUCLEAR MAGNETIZATION IN A LIMITED VOLUME, AND DEVICE FOR PERFORMING THE METHOD

[75] Inventors: Dietmar Kunz, Quickborn; Karl Georg H. Bomsdorf, Hamburg; Jürgen S. Wieland, Pinneberg, all of Fed. Rep. of Germany

[73] Assignee: U.S. Philips Corporation, New York, N.Y.

[21] Appl. No.: 309,465

[22] Filed: Feb. 10, 1989

[30] Foreign Application Priority Data

Feb. 17, 1988 [DE] Fed. Rep. of Germany ....... 3804924

[51] Int. Cl.$^5$ ............................................. G01R 33/20
[52] U.S. Cl. ..................................................... 324/309
[58] Field of Search ................. 324/307, 309, 311, 312

[56] References Cited

U.S. PATENT DOCUMENTS

| | | | |
|---|---|---|---|
| 4,748,409 | 5/1988 | Frahm et al. | 324/307 |
| 4,843,321 | 6/1989 | Sotak | 324/311 |
| 4,843,549 | 6/1989 | McKinnon | 364/413.13 |

FOREIGN PATENT DOCUMENTS 0089034 9/1983 European Pat. Off. ............ 324/307

OTHER PUBLICATIONS

P. R. Luyten et al "Solvent-Suppressed Spatially Resolved Spectroscopy-An Approach to High-Resolution NMR on a Whole-Body MR System", Journal of Magnetic Resonance 67, 148-155 (1986).

*Primary Examiner*—Hezron E. Williams
*Assistant Examiner*—Kevin D. O'Shea
*Attorney, Agent, or Firm*—Jack D. Slobod; Thomas A. Briody; Jack E. Haken

[57] ABSTRACT

A method of a device for determining the spectral distribution of a nuclear magnetization in a limited volume, wherein each sequence of r.f. and gradient excitation comprises a sub-sequence which dephases the nuclear magnetization everywhere outside a defined layer. This sub-sequence is followed by three r.f. pulses, the first two of which are layer-selective. These three r.f. pulses excite the nuclear magnetization in an area of intersection between said layer and two layers which extend perpendicularly to one another and to said layer. In order to suppress undesirable FID signals and to enhance the spectrum, phase cycling is performed.

20 Claims, 3 Drawing Sheets

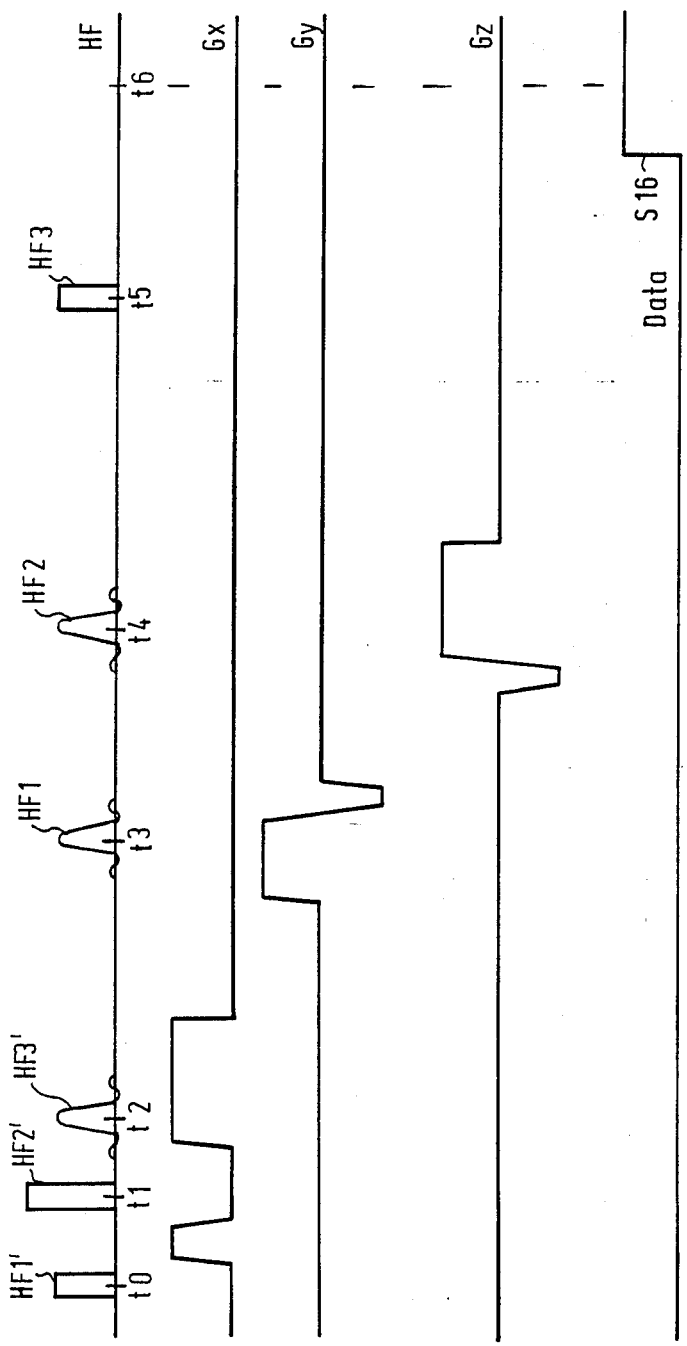
Fig. 3
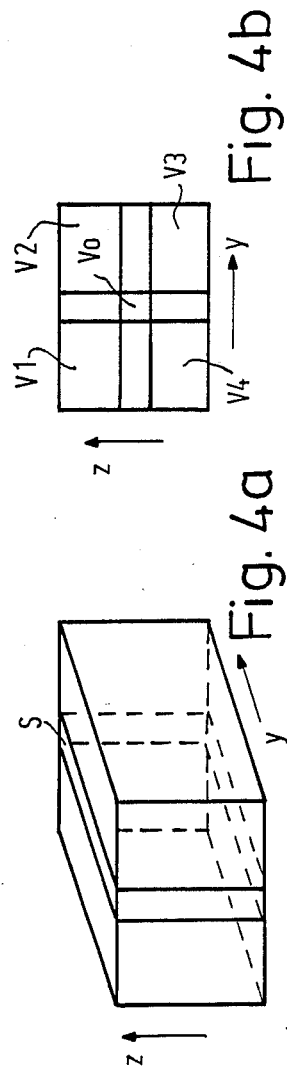
Fig. 4b
Fig. 4a

METHOD OF DETERMINING THE SPECTRAL DISTRIBUTION OF THE NUCLEAR MAGNETIZATION IN A LIMITED VOLUME, AND DEVICE FOR PERFORMING THE METHOD

BACKGROUND OF THE INVENTION

1. Field of the Invention

The invention relates to a method of determining the nuclear magnetisation distribution in a limited volume by means of a plurality of sequences, three r.f. pulses being applied to an examination zone in each sequence in the presence of a steady, uniform magnetic field, the first and the second r.f. pulse cooperating with a respective one of two magnetic fields whose gradients extend perpendicularly with respect to one another, the stimulated echo signals generated in each sequence being added and subjected to a Fourier transformation, and also relates to a device for performing the method.

2. Description of the Prior Art

A method of this kind is known from EP-OS No. 87 200 261 which was published under EPO No. 233675, and to which commonly owned U.S. Pat. No. 4,843,549, issued June 27, 1989, corresponds. A drawback of this method consists in that also the third one of the three r.f. pulses is a so-called layer-selective pulse which is generated in conjunction with a magnetic gradient field and in that a magnetic gradient field is switched on and off again after this pulse and briefly before the reception of the stimulated echo signal. The magnetic gradient field during and after the r.f. pulse generate eddy currents which are active for a longer period of time than the magnetic gradient fields generating these eddy currents. The eddy currents in their turn cause magnetic fields which have a disturbing effect on the phase of the stimulated echo signal.

OBJECT OF THE INVENTION

It is an object of the present invention to provide a method of the kind set forth so that the effect of the eddy currents, caused by the magnetic gradient fields required for the selection of the volume, on the stimulated echo signals is in any case strongly reduced.

SUMMARY OF THE INVENTION

This object is achieved in accordance with the invention in that each sequence comprises a sub-sequence which precedes the three r.f. pulses and which dephases the nuclear magnetisation everywhere outside a layer which extends parallel to the plane defined by the two gradient directions, the sequences taking place in cycles, the sequences being repeated n times in each cycle, where n is larger than or equal to 3, all sequences of a cycle being distinct from one another as regards the phase difference between the first and the second r.f. pulse by 360°/n or an integer multiple thereof which is not zero, the spin resonance signals generated by the sequences being added so that the FID signals produced by the third r.f. pulse, compensate for one another.

In accordance with the invention, the sub-sequence dephases the nuclear magnetisation in the examination zone everywhere outside a given layer. The first two r.f. pulses after the sub-sequence rotate the nuclear magnetisation, at the area of intersection of said layer and two layers extending perpendicularly thereto, in the direction of the uniform, steady magnetic field, or antiparallel thereto. Therefore, at this area of intersection the third r.f. pulse generates a stimulated echo signal. Because no magnetic gradient field is switched on and off during and after this third r.f. pulse, this stimulated echo signal will not be significantly influenced by eddy currents.

A single, possibly identically repeated sequence of this kind, however, is not capable of exciting the nuclear magnetisation of all materials in the examination zone. Moreover, the third r.f. pulse generates disturbing FID signals in the layer outside the area of intersection. So-called phase cycling as disclosed in the claim, however, enables all frequency components in the volume determined by the magnetic gradient fields to be detected and undesirable FID signals stemming from parts of the layer outside this volume to be suppressed.

In a further version of the invention, the phase of the third r.f. pulse of each sequence in a cycle deviates by 360°/n, or an integer multiple of this value, from the phase of this r.f. pulse in the other sequences. This version enables direct addition of the spin resonance signals generated in the individual sequences, after which they can be subjected to a Fourier transformation or first a Fourier transformation can be performed therewith and the resultant spectra can be superposed.

The invention will be described in detail hereinafter with reference to the drawing. Therein:

BRIEF DESCRIPTION OF THE DRAWING

FIG. 3 shows the variation in time of various signals during the execution of the method in accordance with the invention, and FIGS. 4a and 4b show the position of the volumes influenced by the various r.f. pulses.

DETAILED DESCRIPTION OF THE PREFERRED EMBODIMENTS

Figure 1:
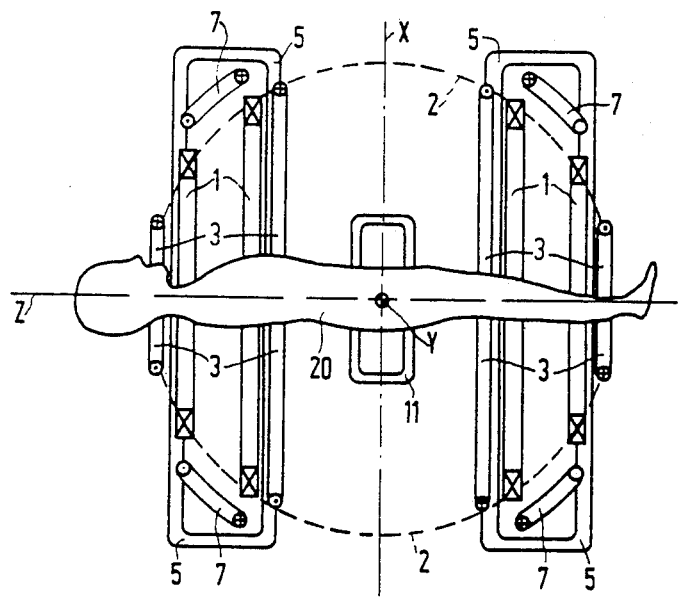
FIG. 1 shows an MR examination apparatus for performing the method in accordance with the invention.

The MR examination apparatus which is diagrammatically shown in FIG. 1 comprises a system which consists of four coils 1 for generating a uniform, steady magnetic field which may be in the order of magnitude of some tenths of T to some T. This field extends in the z-direction of a cartesian coordinate system. The coils 2 are concentrically situated with respect to the z-axis and may be arranged on a spherical surface 2. The patient 20 to be examined is arranged within these coils.

Four coils 3 are preferably arranged on the same spherical surface in order to generate a magnetic field Gz which extends in the z-direction and which linearly varies in this direction. There are also provided four coils 7 which generate a magnetic gradient field Gx (i.e. a magnetic field whose intensity varies linearly in one direction) which also extends in the z-direction but whose gradient extends in the x-direction. A gradient field Gy, extending in the z-direction and having a gradient in the y-direction, is generated by four coils 5 which may be identical to the coils 7 but which have been offset 90° in space with respect thereto. Only two of these coils are shown in FIG. 1.

Because each of the three coil systems 3, 5 and 7 for generating the magnetic gradient fields Gz, Gy and Gx is symmetrically arranged with respect to the spherical surface 2, the field strength in the centre of the sphere, at the same time forming the origin of said cartesian xyz coordinate system is determined only by the steady, uniform magnetic field of the coil system 1.

Furthermore, an r.f. coil 11 is symmetrically arranged with respect to the plane z=0 of the coordinate system, which coil is constructed so that it generates an essentially uniform r.f. magnetic field which extends in the x-direction, i.e. perpendicularly with respect to the direction of the steady, uniform magnetic field. During each r.f. pulse an r.f. modulated current is applied to the r.f. coil by an r.f. generator. Subsequent to three r.f. pulses, the r.f. coil 11 serves for the reception of the stimulated echo signal generated in the examination zone. However, a separate r.f. receiver coil, may be used instead.

Figure 2:
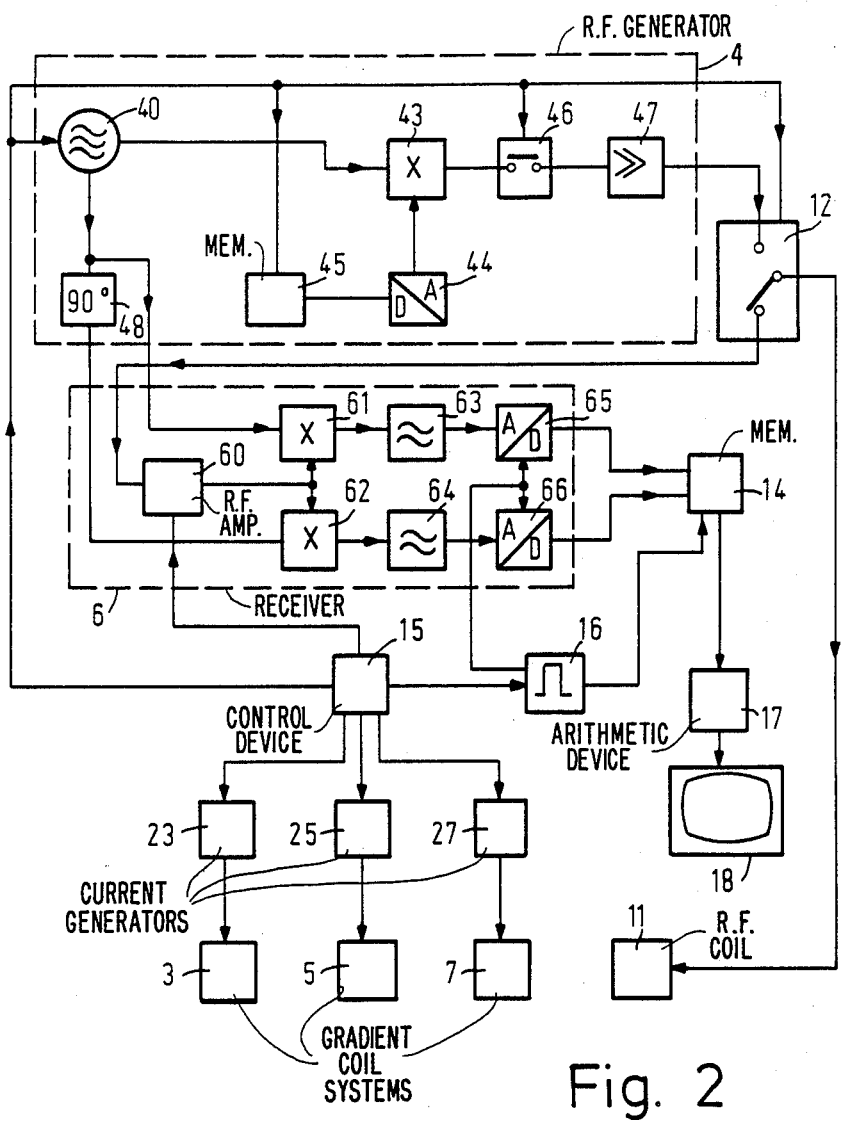
FIG. 2 shows a block diagram of such an apparatus.

FIG. 2 shows a simplified block diagram of this MR examination apparatus. The r.f. coil 11 is connected, via a switching device 12, on the one side to an r.f. generator 4 and on the other side to an r.f. receiver 6.

The r.f. generator 4 comprises an r.f. oscillator 40 whose frequency can be digitally controlled and which produces oscillations of a frequency which is equal to the Larmor frequency of the nuclei to be excited at the field strength generated by the coils 1. As is known, the Larmor frequency f is calculated in accordance with the relation $f=cB$, where B is the magnetic induction in the steady, uniform magnetic field and c is the gyromagnetic ratio which, for example for protons, amounts to 42.56 MHz/T. The output of the oscillator 40 is connected to an input of a mixing stage 43. The mixing stage 43 receives a second input signal from a digital-to-analog converter 44, the output of which is connected to a digital memory 45. Under the control of a control device 15, a sequence of digital data words representing an envelope signal is read from the memory.

The mixing stage 43 processes the input signals applied thereto so that the carrier oscillation modulated with the envelope signal appears on its output. Via a switch 46 which is controlled by the control device 15, the output signal of the mixing stage 43 is applied to an r.f. power amplifier 47 whose output is connected to the switching device 12. This device is also controlled by the control device 15.

The receiver 6 comprises an r.f. amplifier 60 which is connected to the switching device and which receives the stimulated echo signal induced in the r.f. coil 11, for which purpose the switching device must occupy the appropriate position. The amplifier 60 comprises a muting input which is controlled by the control device 15 and via which it can be blocked so that the gain is substantially zero. The output of the amplifier is connected to the first inputs of two multiplying mixing stages 61 and 62, each of which supplies an output signal corresponding to the product of its respective input signals. The second inputs of the mixing stages 61 and 62 receive a signal having the frequency of the oscillator 40, a phase shift of 90° existing between the signals on the two inputs. This phase shift is obtained by means of a 90° phase shifter 48 whose output is connected to the input of the mixing stage 62 and whose input is connected to the input of the mixing stage 61 and to the output of the oscillator 40.

The output signals of the mixing stages 61 and 62 are applied, via low-pass filters 63 and 64 which suppress the frequency supplied by the oscillator 40 as well as all higher frequencies and which conduct low-frequency components, to a respective analog-to-digital converter 65, 66. This converter converts the analog signals of the circuits 61 . . . 64, forming a quadrature demodulator, into digital data words which are applied to a memory 14. The analog-to-digital converters 65 and 66 and the memory 14 receive their clock pulses from a clock pulse generator 16 which can be blocked and released, via a control lead, by the control unit 15 by way of the signal S16, so that the signals supplied by the r.f. coil 11 and transposed to the low frequency range can be converted into a sequence of digital data words for storage in the memory 14 only during a measuring interval which is determined by the control device 15.

The three coil systems 3, 5 and 7 are fed by the current generators 23, 25 and 27 with a respective current whose variation in time can be controlled by the control unit 15. The data words or sampling values stored in the memory 14 are applied to an arithmetic device 17 which determines the spectral distribution of the nuclear magnetisation therefrom by way of a discrete Fourier transformation, the distribution determined being applied to a suitable display unit, for example a monitor 18.

FIG. 3 shows the variation in time of various signals received or generated by means of the circuit shown in FIG. 2 during execution of the method in accordance with the invention. The first line shows the variation in time of the output signal of the r.f. generator 4. The second, the third and the fourth line show the variation in time of the magnetic gradient field Gx, Gy, Gz, respectively, generated by means of the coil systems 7, 5, 3 and the generators 27, 25, 23, respectively. The fifth line shows the variation in time of the control signal applied to the clock pulse generator 16 by the control device 15.

The pulses HF1′, HF2′ and HF3′ ensure, in conjunction with the magnetic gradient field Gx, that in a layer S (see FIG. 4a), extending perpendicularly with respect to the x-direction, the nuclear magnetisation extends in the z-direction or in the -z-direction, i.e. in parallel or anti-parallel with respect to the steady, uniform magnetic field and that the nuclear magnetisation is dephased everywhere outside the layer.

The first r.f. pulse HF1′ is a broad-band 90° r.f. pulse whose centre occurs at the instant t0. The FID signal relating to this r.f. pulse is dephased by the magnetic gradient field Gx activated between this r.f. pulse and the next r.f. pulse HF2′. The second r.f. pulse HF2′ is a broadband 180° r.f. pulse which occurs at the instant t1. A narrow band 90° r.f. pulse HF3′ occurs at the instant t2, t2 preferably being chosen so that the 180° r.f. pulse HF2′ is situated halfway between the two r.f. pulses HF1′ and HF3′. During this r.f. pulse HF3′, the magnetic gradient field Gx is activated again, so that the nuclear magnetisation in a layer perpendicular to the x-axis (the layer S) is influenced differently from the nuclear magnetisation outside the layer; the integral over the magnetic gradient field Gx between the two r.f. pulses HF1′ and HF2′ is then equal to the integral of the field Gx after the second r.f. pulse HF2 until the instant t2.

The r.f. pulse HF1′ excites the entire examination zone because it is not layer-selective. The related FID signal (i.e. the signal produced by the free induction decay), however, is dephased by the magnetic gradient field Gx activated and de-activated after the first r.f. pulse and before the 180° r.f. pulse HF2′. Because after the second r.f. pulse the magnetic gradient field is activated once more and satisfies said integral equation until the instant t2, a spin echo signal is obtained in the examination zone at the instant t2. However, the 90° r.f. pulse HF3′ rotates the nuclear magnetisation through 90° again in said layer S in the examination zone, so that subsequently the nuclear magnetisation in this layer extends either in the z-direction again or anti-parallel thereto. However, because the r.f. pulse HF3' has an effect only on the layer S at the instant t2. This nuclear magnetisation has been excited throughout the examination zone outside the layer S. This nuclear magnetisation, however, is dephased in that the magnetic gradient field Gx remains activated beyond the instant t2. After de-activation of this gradient field, the entire examination zone no longer supplies spin resonance signals; the nuclear magnetisation inside the layer can still be excited by a further pulse, but this is not possible for the dephased nuclear magnetisation outside the layer, at least for as long as the nuclear magnetisation is dephased. Such a sub-sequence is known per se, see J. Magn. Reson. 67, 148-155 (1986).

This sub-sequence is succeeded by a narrow-band 90° r.f. pulse HF1 (at the instant t3) initiating the activation of a magnetic gradient field Gy. The variation in time of the magnetic gradient field Gy is chosen so that the integral over this magnetic gradient field from the instant t3 until de-activation of this field has exactly the value zero. The magnetic gradient field Gy is activated already before the start of the r.f. pulse HF1. As a result, the nuclear magnetisation outside the layer S is additionally dephased. In conjunction with the magnetic gradient field Gy the r.f. pulse HF1 ensures that the nuclear magnetisation is excited in a layer extending perpendicularly with respect to the y-direction.

Subsequent to the 90° pulse HF1, a further narrow band 90° r.f. pulse HF2 appears at the instant t4. During this r.f. pulse the magnetic gradient field Gz is activated so that the time integral from the beginning of activation until the instant t4 has exactly the value zero. The gradient field remains activated for some time after the instant t4, but is de-activated prior to the next r.f. pulse HF3.

Because no magnetic gradient field is activated during this r.f. pulse, it covers the entire examination zone. It may concern a broadband ("hard") 90° r.f. pulse, but also a frequency-selective 90° r.f. pulse. When this r.f. pulse is formed so that the nuclear magnetisation of protons bound to fat is not excited thereby, the appearance of fat signals is prevented; such fat signals may have a disturbing effect, for example in r.f. spectroscopy of, for example the brain. When the spectroscopic examination is disturbed by strong signals from water-bound protons, the frequency selective r.f. pulse HF3 must be formed so that its spectrum does not contain the frequency required for the excitation of water.

The second r.f. pulse HF2 influences the nuclear magnetisation in a layer perpendicular to the z-axis. The third r.f. pulse HF3, occurring at the instant t5, causes a stimulated echo signal as a spin resonance signal at the area of intersection Vo (see FIG. 4b) of the layer S and the layers excited by the r.f. pulses HF1 and HF2. This signal occurs at the instant t6 at a distance from the r.f. pulse HF3 which corresponds to the distance in time (t4-t3) between the r.f. pulse HF2 and the r.f. pulse HF1. Therefore, at the instant t6, or briefly before that, the enable signal S16 supplied by the control device 15 for the clock generator 16 is available (see FIG. 3, line 5), so that the signal components occurring as from the enabling in the channels 61 . . . 65 and 62 . . . 66 are detected and stored in the memory 14. In order to determine its frequency spectrum or special distribution, this signal is subjected to a discrete Fourier transformation in the arithmetic device 17, preferably after formation of the mean value of the stimulated echo signals of sequences similar to the sequence shown in FIG. 3.

The advantage of this method with respect to the known method described in the preamble consists in that during the third r.f. pulse HF3 and subsequently no magnetic gradient field is activated. At the instant of occurrence of the stimulated echo signal, the eddy currents caused by the magnetic gradient field last activated (i.e. the field Gz during and after the second r.f. pulse HF2) have decayed substantially completely, so that the stimulated echo signal, and hence the frequency spectrum derived therefrom, is hardly influenced by these eddy currents.

However, the stimulated echo signal produced by the sequence shown in FIG. 3 is not suitable for determining the frequency spectrum; this is not only because of the poor signal-to-noise ratio (which could be improved by repetition and by forming the mean value for the signals recovered), but notably because of the fact that in this spin resonance signal part of the spectral components excited by the first r.f. pulse is suppressed and because, moreover, other spin resonance signals occur which do not depend on the nuclear magnetisation in the desired zone Vo. This can be explained as follows: signals of materials in the zone Vo whose Larmor frequency leads or lags in the interval t4-t3 the central frequency of the r.f. pulses by one quarter period (or an odd multiple thereof) are not rotated in the z-direction or anti-parallel thereto by the second r.f. pulse HF2, and hence they are dephased by the gradient field Gz which is still active after t4, so that their spectral contribution cannot appear in the stimulated echo signal. The components whose Larmor frequency is between the Larmor frequency of said materials and a Larmor frequency which is exactly in phase with the central frequency of the r.f. pulses HF1 and HF2 are more or less suppressed.

Moreover, FID signals which originate from zones in the layer which are situated outside the layers influenced by the r.f. pulses HF1 and HF2 are superposed on the stimulated echo signal from the zone Vo. In the parts of said layers which are situated outside Vo the nuclear magnetisation is determined by one of the two 90° r.f. pulses HF1 or HF2 and by the third 90° r.f. pulse HF3. In these parts the nuclear magnetisation extends either in the z-direction or perpendicular thereto so that it does not contribute to the spin resonance signal. Outside these layers, however, excitation takes place only by the third r.f. pulse HF3 so that in these zones of the layer S the third r.f. pulse generates FID signals which are superposed on the stimulated echo signal from the zone Vo. FIG. 4b, being a plan view of the layer S, shows the position of these zones V1, V2, V3 and V4.

However, the above fully or partly suppressed spectral zones can be completely covered and said FID signals can be suppressed when use is made of the phase cycling described hereinafter. Phase cycling is to be understood to mean that each time after a given repetition time a sequence is repeated a number of times, the phase of at least one r.f. pulse being changed from one sequence to another. The phase of an r.f. pulse is to be understood relative to a coordinate system rotating at the central frequency of the r.f. pulse. In particular, the phase is the angle, with respect to the x- (or y-) axis of the rotating coordinate system, of magnetic field components of the r.f. pulse rotating in the same direction as the coordinate system.

The following table shows a suitable series of sequences for such phase cycling.

|  | HF1 | HF2 | HF3 |
|---|---|---|---|
| 1st sequence | x | x | x |
| 2nd sequence | x | x + 120° | x − 120° |
| 3rd sequence | x | x + 240° | x − 240° |

During the first sequence, the three r.f. pulses HF1, HF2 and HF3 have the same phase. During the second sequence, the phase of the second r.f. pulse has been shifted +120° with respect to the phase of the first r.f. pulse, the phase of the third r.f. pulse having been shifted −120° with respect to that of the first r.f. pulse. During the third sequence, the phase of the second r.f. pulse HF2 has been shifted through 240° and that of the third r.f. pulse HF3 has been shifted 240° with respect to the phase of the first r.f. pulse HF1.

The shifting of the phases of the r.f. pulses can be realised, for example by briefly changing the frequency of the oscillator 40 after the first and the second r.f. pulse until there is obtained, with respect to the original oscillation a temporal phase shift which corresponds to the desired (spatial) phase shift, after which the frequency is controlled to its original value again. The oscillation of the oscillator has then been shifted, for example 120° with respect to the original oscillation, so that the component of the r.f. magnetic field generated by the coil 11 and rotating with the coordinate system also occupies a position shifted through 120° in this coordinate system. After the third r.f. pulse, the phase of the oscillator 40 is restored to its original position, for example by a temporary change of the frequency.

Because the phases of the third r.f. pulse have been shifted through each time 120° in the three sequences, the same phase shift is also obtained in the FID signals resulting from this third pulse in the individual sequences. Consequently, these signals compensate for one another when they are added. Because, moreover, the phase difference between the first r.f. pulse and the second r.f. pulse is each time changed by 120° from one sequence to another, in the second and the third sequence the second r.f. pulse HF2 also excites the components whose Larmor frequency is such that a phase shift of 90° (or an odd integer multiple thereof) occurs with respect to the oscillator frequency in the interval between the first and the second r.f. pulse and which, therefore, are not excited during the first sequence. Consequently, the addition of the stimulated echo signals resulting from the three sequences produces a sum signal which contains the frequency components of all materials which are present in the volume Vo and which can be excited by the r.f. pulses HF1, HF2 and HF3. The frequency spectrum of the zone Vo is thus obtained from the Fourier transformation over this sum signal. In order to improve the signal-to-noise ratio, the cycle consisting of the three sequences is preferably repeated a number of times, the components thus produced being added and subsequently subjected to a Fourier transformation.

For the cycle described in the above table it is necessary that the phase is shifted 120°. In many spectrometers, however, the phase can be changed only by 90° or a multiple thereof. Therefore, the following table shows a cycle of four sequences which can be performed by means of such a spectrometer and which also produces the desired phase cycling.

|  | HF1 | HF2 | HF3 |
|---|---|---|---|
| 1st sequence | x | x | x |
| 2nd sequence | x | y | −y |
| 3rd sequence | x | −x | −x |
| 4th sequence | x | −y | y |

During the first sequence, all three r.f. pulses HF1...HF3 rotate the nuclear magnetisation about the x-axis in the clockwise direction, i.e. the rotating component of the r.f. magnetic field extends in the y-direction. During the second sequence, the second r.f. pulse rotates the nuclear magnetisation about the y-axis and the third r.f. pulse rotates the nuclear magnetisation about the −y-axis, i.e. the rotating component of the r.f. field extends in the +x-direction and the −x-direction. The second pulse HF2 in the second sequence results in maximum excitation of all components which have not been excited by the second r.f. pulse in the first sequence, because they extend exactly parallel to the rotating component of the magnetic field or antiparallel thereto at the instant of this r.f. pulse.

During the third sequence, the nuclear magnetisation is rotated about the −x-axis by the second and the third r.f. pulse, whilst the first r.f. pulse rotates the nuclear magnetisation about the x-axis, i.e. the phase of the second and the third r.f. pulse HF2 and HF3 has been shifted 180° with respect to the first r.f. pulse HF1. Accordingly, the phase of the second r.f. pulse during the fourth sequence has been shifted 270° (or −90°) with respect to that of the first r.f. pulse, the phase of the third r.f. pulse having been shifted 90°.

This second table shows that the third r.f. pulse has the opposite phase position in the first and the second sequence with respect to that in the third and the fourth sequence, respectively.

Consequently, the FID signal components in the spin resonance signals compensate for one another when they are added. It also appears that the second r.f. pulse in the second sequence influences the signal components which cannot be influenced by the second r.f. pulse HF2 in the first sequence and vice versa. The sam holds good for the second r.f. pulse in the third and the fourth sequence. Consequently, the summing of the spin resonance signals generated by the four sequences produces a sum signal which represents a stimulated echo signal which has been influenced in the same way by all components in the zone Vo.

Summing is realised in that the output signals S65 of the A/D converter 65 which occur after the individual sequences are added by adding the data words representing the spin resonance signal in the same position in time with respect to the associated sequence. The same is done with the output signals S66 of the A/D converter 66. The signals S65 and S66 can be considered as the real and the imaginary part of a complex signal Sk=S65+iS66 wherefrom the (complex) frequency spectrum is determined by a discrete, complex Fourier transformation. Because the Fourier transformation is a linear operation, the sequence of summing and Fourier transformation could also be interchanged.

In order to improve the signal-to-noise ratio it is effective to repeat the described cycles a number of times and to add the signals S65 and S66 then occurring in the described manner before the Fourier transformation. The sequences of a cycle need not directly succeed one another. For example, it may be effective to generate first 50 times in succession the first sequence of the cycle shown in the second table, followed by 50 times the second sequence, etc.

The phase position of the r.f. pulses HF1', HF2', HF3' preceding the three r.f. pulses HF1, HF2 and HF3 can be chosen as desired; therefore, it need not be varied.

The denomination of the phase position of the first r.f. pulses in the cycle by the letter "x" is arbitrary per se; it is only important that the phase position of the subsequent pulses HF2 and HF3 is distinct therefrom in the described manner.

For the removal of the drawbacks involved in a single sequence as shown in FIG. 3, the required phase cyling is subject to the following general conditions:

(a) a cycle should comprise at least three sequences,
(b) for a cycle comprising n sequences, the phase difference between the first r.f. pulse HF1 and the second r.f. pulse HF2 of a sequence should deviate 360°/n, or an integer multiple thereof from the corresponding phase differences in the other sequences of this cycle,
(c) the phase of the third r.f. pulse in relation to a reference phase (for example, x) used for demodulation in 61 should be exactly the negative of the phase difference selected sub (b) for each sequence of the cycle.

If this is not the case, the output signals S65 and S66 should be replaced, prior to the addition to the corresponding signals of previous sequences, by the intermediate signals S65' and S66' in accordance with the following equations:

$$S65' = S65 \cos\beta + S66 \sin\beta \quad (1)$$

$$S66' = S66 \cos\beta - S65 \sin\beta \quad (2)$$

Therein, $\beta$ is the difference between the phase to be assumed by the third r.f. pulse HF3 in accordance with the condition (c) and the actual phase.

In accordance with the cycles defined in the two tables, the third r.f. pulse of each sequence each time has the reference phase, so that $\beta = 0$ and in accordance with the equations (1) and (2) S65' becomes S65 and S66' becomes S66. However, if for example the phase HF3 of the third r.f. pulse of the fourth sequence (second table) were to be replaced by an r.f. pulse having the phase x, $\beta$ would amount to 90° and the following would appear from the equations (1) and (2):

$$S65' = S66 \text{ and } S66' = S65$$

i.e. the spin resonance signal S65 digitised by the analog-to-digital converter 65 should be subtracted from the signals S66 digitised and stored by the analog-to-digital converter 66 during the preceding sequences, and the output signal S66 of the analog-to-digital converter 66 should be added to the output signals S65 of the analog-to-digital converter 65 during the preceding three sequences. The third r.f. pulse of the third sequence may also have the same phase as the third r.f. pulse HF3 of the first sequence in the second table. In that case $\beta = 180°$ and in accordance with the equations (1) and (2):

$$S65 = -S65 \text{ and } S66 = -S66.$$

Similarly, x could also be chosen at the phase of the third r.f. pulse HF3 in the second sequence ($\beta = 270$), so that the third r.f. pulse HF3 would have the same phase in all four sequences. When this is compensated for in accordance with the equations (1) and (2), the additional advantage is obtained that any incorrect adjustments of the zero point of the receiving unit become apparent.

Demonstrating the existence of metabolites is often desirable in medical diagnostics. These metabolites generally have a J-coupling to a scalar coupling constant J of, for example 7 Hz. The spectrum of such metabolites is cosinusoidally dependent on the distance in time t4-t3 between the two r.f. pulses HF2 and HF1, the zero position being obtained when this distance in time corresponds to the reciprocal value of twice the scalar coupling constant, i.e. it is situated at approximately 70 ms. In order to avoid cancellation of the spectral components of these metabolites, therefore, the distance in time between the two r.f. pulses HF1 and HF2 should be as small as possible, for example 10 ms, or must be twice as large as the period of time required for cancellation, for example approximately 140 ms.

The sequence can be composed so that the signal components generated by the water component in the volume Vo are suppressed. To this end, instead of the third r.f. pulse HF3 use can be made of a frequency-selective r.f. pulse, for example a so-called binomial r.f. pulse which is formed so that it cannot excite the nuclear spins of water-bound hydrogen protons.

We claim:

1. A method of determining the nuclear magnetisation distribution in a limited volume by means of a plurality of sequences, three r.f. pulses being applied to an examination zone in each sequence in the presence of a steady, uniform magnetic field, the first and the second r.f. pulse cooperating with a respective one of two magnetic fields whose gradients extend perpendicularly with respect to one another, stimulated echo signals generated in each sequence being added and subjected to a Fourier transformation, characterized in that each sequence comprises a sub-sequence (HF1' ... HF3') which precedes the three r.f. pulses (HF1 ... HF3) and which dephases the nuclear magnetisation everywhere outside a layer (S) in said examination zone which extends parallel to the plane defined by the two gradient directions (Gy, Gz), the sequences taking place in cycles, the sequences being repeated n times in each cycle, where n is larger than or equal to 3, all sequences of a cycle being distinct from one another as regards the phase difference between the first and the second r.f. pulse by 360°/n or an integer multiple thereof which is not zero, the spin resonance signals generated by the sequences being added so that FID signals produced by the third r.f. pulse (HF3) compensate for one another.

2. A method as claimed in claim 1, characterized in that the three r.f. pulses (HF1 ... HF3) are 90° pulses.

3. A method as claimed in claim 1, characterized in that the sub-sequence comprises a first 90° r.f. pulse (HF1'), a 180° r.f. pulse (HF2') and a second 90° r.f. pulse (HF3'), the two 90° r.f. pulses (HF1' and HF3') being situated at the same distance from the 180° r.f. pulse (HF2'), between the first 90° r.f. pulse and the 180° r.f. pulse and after the 180° r.f. pulse there being activated a magnetic field with a gradient (Gx) which extends perpendicularly with respect to the layer to be influenced, the integral over this gradient between the first 90° r.f. pulse (HF1') and the 180° r.f. pulse (HF2') being equal to the integral over this magnetic field from the end of the 180° pulse until the centre (t2) of the second 90° r.f. pulse (HF3').

4. A method as claimed in claim 3, characterized in that the magnetic field remains activated beyond the end of the second 90° r.f. pulse (HF3').

5. A method as claimed in claim 1, characterized in that the distance between the first (HF1) and the second r.f. pulse (HF2) corresponds to either the reciprocal value of the scalar coupling constant J, or a multiple thereof, or is small in comparison with the reciprocal value.

6. A method as claimed in claim 1, characterized in that the phase of the third r.f. pulse (HF3) of the sequences with reference to a reference phase (x) is equal to the negative value of the phase difference between the first and the second r.f. pulse (HF1 and HF2).

7. A method as claimed in claim 1, characterized in that the third one (HF3) of the three r.f. pulse (HF1 ... HF3) is a frequency-selective r.f. pulse.

8. A method as claimed in claim 3, characterized in that the three r.f. pulses (HF1 ... HF3) are 90° pulses.

9. A method as claimed in claim 5, characterized in that the three r.f. pulses (HF1 ... HF3) are 90° pulses.

10. A method as claimed in claim 7, characterized in that the three r.f. pulses (HF1 ... HF3) are 90° pulses.

11. A method as claimed in claim 4, characterized in that the three r.f. pulses (HF1 ... HF3) are 90° pulses.

12. A method as claimed in claim 4, characterized in that the distance between the first (HF1) and the second r.f. pulse (HF2) corresponds to either the reciprocal value of the scalar coupling constant J, or a multiple thereof, or is small in comparison with the reciprocal value.

13. A method as claimed in claim 11, characterized in that the distance between the first (HF1) and the second r.f. pulse (HF2) corresponds to either the reciprocal value of the scalar coupling constant J, or a multiple thereof, or is small in comparison with the reciprocal value.

14. A method as claimed in claim 2, characterized in that the phase of the third r.f. pulse (HF3) of the sequences with reference to a reference phase (x) is equal to the negative value of the phase difference between the first and the second r.f. pulse (HF1 and HF2).

15. A method as claimed in claim 3, characterized in that the phase of the third r.f. pulse (HF3) of the sequences with reference to a reference phase (x) is equal to the negative value of the phase difference between the first and the second r.f. pulse (HF1 and HF2).

16. A method as claimed in claim 13, characterized in that the phase of the third r.f. pulse (HF3) of the sequences with reference to a reference phase (x) is equal to the negative value of the phase difference between the first and the second r.f. pulse (HF1 and HF2).

17. A method as claimed in claim 11, characterized in that the phase of the third r.f. pulse (HF3) of the sequences with reference to a reference phase (x) is equal to the negative value of the phase difference between the first and the second r.f. pulse (HF1 and HF2).

18. A method as claimed in claim 3, characterized in that the phase of the third r.f. pulse (HF3) of the sequences with reference to a reference phase (x) is equal to the negative value of the phase difference between the first and the second r.f. pulse (HF1 and HF2).

19. A method as claimed in claim 17, characterized in that the phase of the third r.f. pulse (HF3) of the sequences with reference to a reference phase (x) is equal to the negative value of the phase difference between the first and the second r.f. pulse (HF1 and HF2).

20. A device for determining the nuclear magnetization distribution in a limited volume by means of a plurality of sequences applied to an examination zone comprising a magnet for generating a uniform, steady magnetic field in said examination zone, an r.f. coil system for generating an r.f. coil system with r.f. pulses, a gradient coil system for generating magnetic fields which extend in the direction of the steady magnetic field and which comprise gradients in different directions, generators for powering the gradient coils, a control unit for controlling the r.f. generator and the generators, and an arithmetic device for processing the stimulated r.f. signal, characterized in that the control unit is programmed so that it generates a plurality of sequences, each of which includes a sub-sequence (HF1' ... HF3') whereby the nuclear magnetisation is dephased everywhere outside a layer (S), after which three r.f. pulses (HF1 ... HF3) are generated, the first and the second r.f. pulse acting on the examination zone in the presence of a magnetic field having gradients (Gy, Gz) which extend perpendicularly to one another and to the layer, there being generated cycles comprising n sequences, where n is larger than or equal to 3, in which the phase difference between the first and the second r.f. pulse after the subsequence deviates by 360°/n, the arithmetic device being programmed so that the spin resonance signals generated by the individual sequences are added so that FID signals generated by the third r.f. pulse compensate for one another.

* * * * *